(12) United States Patent
Kounou et al.

(10) Patent No.: US 9,201,299 B2
(45) Date of Patent: Dec. 1, 2015

(54) INORGANIC FILLER AND ORGANIC FILLER-CONTAINING CURABLE RESIN COMPOSITION, RESIST FILM COATED PRINTED WIRING BOARD, AND METHOD FOR PRODUCING THE SAME

(71) Applicant: SAN-EI KAGAKU CO., LTD., Tokyo (JP)

(72) Inventors: Toshimitsu Kounou, Saitama (JP); Yasuhiro Kuroyanagai, Saitama (JP); Yukihiro Usui, Saitama (JP); Makoto Obunai, Saitama (JP)

(73) Assignee: SAN-EI KAGAKU CO., LTD., Tokyo (JP)

( * ) Notice: Subject to any disclaimer, the term of this patent is extended or adjusted under 35 U.S.C. 154(b) by 0 days.

(21) Appl. No.: 13/768,734

(22) Filed: Feb. 15, 2013

(65) Prior Publication Data

US 2013/0164679 A1 Jun. 27, 2013

Related U.S. Application Data

(63) Continuation-in-part of application No. 12/205,395, filed on Sep. 5, 2008, now abandoned.

(30) Foreign Application Priority Data

Oct. 1, 2007 (JP) .................................. 2007-280962
Aug. 26, 2008 (JP) .................................. 2008-244913

(51) Int. Cl.
| | |
|---|---|
| G03F 7/029 | (2006.01) |
| G03F 7/004 | (2006.01) |
| C08L 33/14 | (2006.01) |
| C08L 63/04 | (2006.01) |
| G03F 7/038 | (2006.01) |
| G03F 7/075 | (2006.01) |
| C08F 20/28 | (2006.01) |
| G03F 7/033 | (2006.01) |

(52) U.S. Cl.
CPC ................ *G03F 7/004* (2013.01); *C08F 20/28* (2013.01); *C08L 33/14* (2013.01); *C08L 63/04* (2013.01); *G03F 7/0382* (2013.01); *G03F 7/0385* (2013.01); *G03F 7/0388* (2013.01); *G03F 7/0757* (2013.01); *G03F 7/033* (2013.01); *H05K 2201/0209* (2013.01); *H05K 2201/0212* (2013.01)

(58) Field of Classification Search
None
See application file for complete search history.

(56) References Cited

U.S. PATENT DOCUMENTS

| | | | |
|---|---|---|---|
| 4,239,813 A | | 12/1980 | Murakami et al. |
| 4,948,700 A | * | 8/1990 | Maeda et al. .............. 430/280.1 |
| 6,232,398 B1 | * | 5/2001 | Funada et al. ................ 525/107 |
| 6,399,277 B1 | * | 6/2002 | Nojima et al. ............. 430/280.1 |
| 7,282,257 B2 | | 10/2007 | Orikabe et al. |
| 7,645,514 B2 | | 1/2010 | Watanabe et al. |
| 2003/0144381 A1 | * | 7/2003 | Mizuta et al. ................. 523/400 |
| 2006/0074168 A1 | | 4/2006 | Nelson et al. |
| 2006/0154078 A1 | | 7/2006 | Watanabe et al. |
| 2007/0122094 A1 | | 5/2007 | Chien et al. |

FOREIGN PATENT DOCUMENTS

| | | |
|---|---|---|
| CN | 1254182 | 5/2000 |
| CN | 101037259 | 9/2007 |
| EP | 0 969 058 | 1/2000 |
| JP | 6-335992 | 12/1994 |
| JP | 2008-083963 | 3/1996 |
| JP | 2003-152295 | 5/2003 |
| JP | 2004-277727 | 10/2004 |
| JP | 2004-277729 | 10/2004 |
| JP | 2005-019770 | 1/2005 |
| JP | 2006-179888 | 7/2006 |
| KR | 2003-0053304 A | 11/2003 |
| KR | 2003-86450 | 11/2003 |
| TW | 200407383 | 5/2004 |

OTHER PUBLICATIONS

Tamai et al., Macromolecules, 1999, vol. 32, pp. 6102-6110 published on WEB Aug. 26, 1999 by American Chemical Society.
Pham et al., Epoxy Resins an article from Ullmann's Encyclopedia of Industrial Chemistry, published online Oct. 15, 2005, the pdf version with pp. 1-3, 22-24, 50 and 86-94.
Korean Patent Office issued a Korean Office Action dated May 6, 2010, Application No. 2003-0086450.
Chinese Patent Office issued a Chinese office Action dated May 11, 2010, Application No. 200811016808.2.
Derwent-Acc-No. 2009-G66656, Inventor Azeyanagi et al., Abstract of Patent family of US application 2008-205395 filed Sep. 5, 2008.
English translation of KR-2003-0053304-A published Nov. 10, 2003 machine generated at KIPO website, 10 pages.
Derwent-Acc-No. 2004-705702, Derwent-Week, 200469, abstract of KR 200303086450 A Published Nov. 10, 2003, 2 pages.
"Modulus of Elasticity", Instron, Glossary of Materisl Testing Terms, http://www.instron.uswa/resourcecenter/glossaryterm.apx?ID=99 &ref=http://google.com/url downloaded Jul. 21, 2010, 2 pages.
Korean Official Action in corresponding Korean Application No. 10-2008-0087198.
German Office Action issued Feb. 2, 2011 in corresponding German Application No. 10 2008 045 424.9-43 with English translation of German Office Action.
TW Office Action dated May 2, 2012.
International Standard, ISO 527-2, Second edition Feb. 15, 2012, Plastics—Determination of tensile properties.

* cited by examiner

*Primary Examiner* — Cynthia Hamilton
(74) *Attorney, Agent, or Firm* — Young & Thompson

(57) ABSTRACT

A curable resin composition comprises: (I) 100 parts by weight of a curable resin; (II) 10 to 1200 parts by weight of an inorganic filler; and (III) 1 to 100 parts by weight of an organic filler having an elastic modulus of 1 to 2000 (MPa) and an average particle diameter of 0.01 to 10 μm, wherein a content weight ratio of the components (II) and (III) is 1 to 41.

15 Claims, No Drawings

INORGANIC FILLER AND ORGANIC FILLER-CONTAINING CURABLE RESIN COMPOSITION, RESIST FILM COATED PRINTED WIRING BOARD, AND METHOD FOR PRODUCING THE SAME

FIELD OF THE INVENTION

The present invention relates to a curable resin composition useful as a resist ink for a printed wiring board (particularly, a white printed wiring board and a printed wiring board for mounting heat-generating components, or the like), a resist film coated printed wiring board, and a method for producing the same.

DESCRIPTION OF THE RELATED ART

Curable resin compositions containing (packing) various functional inorganic fillers have been conventionally known. For example, there have been known thermosetting resins containing a colorant (titanium oxide) and a fluorescent agent as a reflective inorganic filler in order to enhance the reflectivity of a white laminated sheet for printed wiring substrates in the visible short wavelength region (Patent Document 1).

Alternatively, there have been known thermosetting resin varnishes containing a high-thermal conductive material (alumina or the like) as a thermal radiation inorganic filler in order to apply high thermal radiation to a cover insulating layer of a metal substrate which mounts high-density packaging parts having a large calorific value such as power transistors or hybrid IC (Patent Document 2).

However, when the inorganic filler is mixed in a large amount with the curable resin composition in any case described above, the crack resistance of the obtained cured film is unfortunately insufficient. Therefore, there is a natural limit to the packing amount of the functional inorganic filler, and large enough functional properties (reflectivity of light and thermal radiation or the like) cannot be applied to the cured film.

[Patent Document 1] Japanese Patent Application Laid-Open No. 2003-152295
[Patent Document 2] Japanese Patent Application Laid-Open No. 08-83963

SUMMARY OF THE INVENTION

Problems Invention is to Solve

It is an object of the present invention to provide a curable resin composition applying larger functional properties to the cured film.

Particularly, it is an object of the present invention to provide a curable resin composition suitable for a resist ink for white printed wiring boards or the like applying a resist film excellent in reflectivity of light, crack resistance and resistance to yellowing or the like. Alternatively, it is another object of the present invention to provide a curable resin composition suitable for a resist ink for heat-generating components mounting printed wiring boards or the like applying a resist film excellent in thermal radiation, crack resistance and discoloration resistance or the like.

Means for Solving the Problems

The present inventors have conducted earnest studies to attain the above object, and, as a result, the inventors have accomplished the following invention.

That is, a first aspect of the present invention provides a curable resin composition comprising:
(I) For 100 parts by weight of a curable resin;
(II) 10 to 1200 parts by weight of an inorganic filler; and
(III) 1 to 100 parts by weight of an organic filler having an elastic modulus measured by using a tensile tester according to ISO 527-2: 1993, first edition, with a sample produced by moulding the organic fillers at 150 to 200° C. using a vacuum pressurization press machine of 1 to 2000 (MPa) and an average particle diameter of 0.01 to 10 µm, wherein a content weight ratio of the components (II) to (III) is 1 to 41.

A second aspect of the present invention provides the curable resin composition according to the first aspect of the present invention, wherein the component (II) is a white pigment and/or a material having thermal conductivity of 1.0 to 500 (W/m·K).

A third aspect of the present invention provides the curable resin composition according to the first or second aspect of the present invention, wherein the component (III) contains rubber particles.

A fourth aspect of the present invention provides the curable resin composition according to any of the first to third aspects of the present invention, wherein the curable resin composition is (A) a photo-thermosetting resin composition containing the following resins (I-1), (I-2) and components (II) to (VI), (B) a thermosetting resin composition containing the following resin (I-2), and components (II), (III) and (VI), or (C) a photo-setting resin composition containing the following resin (I-1) and components (II) to (V):
(I-1) a photo-setting resin;
(I-2) a thermosetting resin;
(II) an inorganic filler;
(III) an organic filler;
(IV) a photoreactive monomer;
(V) a photo curing agent; and
(VI) a thermal curing agent.

A fifth aspect of the present invention provides the curable resin composition according to the fourth aspect of the present invention, wherein the resin (I-1) is a reaction product of an acid group-containing acrylic resin obtained by polymerizing an ethylenic unsaturated acid as an essential monomer and alicyclic epoxy group and/or oxetane group-containing unsaturated compound, the reaction product having no aromatic ring in a molecule, and/or a reaction product of an alicyclic epoxy group and/or oxetane group-containing resin obtained by polymerizing an alicyclic epoxy group and/or oxetane group-containing unsaturated compound as an essential monomer and acid group-containing unsaturated compound, the reaction product having no aromatic ring in a molecule.

A sixth aspect of the present invention provides a method for producing a resist film coated printed wiring board, wherein a resist film is formed from the curable resin composition according to any of the first to fifth aspects of the present invention.

A seventh aspect of the present invention provides a resist film coated printed wiring board produced by the method according to the sixth aspect of the present invention.

The present invention can provide the curable resin composition providing the cured film having excellent crack resistance even when the inorganic filler is mixed in a large amount with the curable resin composition to enable of the mixture of the functional inorganic filler in a larger amount, thereby applying larger functional properties to the cured film.

Hereinafter, the present invention will be described in detail with reference to the best embodiment.

A curable resin composition according to the present invention contains (I) a curable resin. Examples of the components (I) include (I-1) a photo-setting resin. As the resin (I-1), a photo-setting (particularly, ultraviolet curable) prepolymer (particularly, an oligomer or a polymer) having a carboxyl group and at least two ethylenically unsaturated bonds in one molecule is preferable. Alternatively, it is preferable that the resin (I-1) has an average molecular weight of 1000 to 100000 (particularly, 3000 to 70000) and an acid value of 300 (mgKOH/g) or less (particularly, 30 to 160 (above all, 40 to 130)). When the acid value is excessively small, the alkali developability may be insufficient. On the other hand, when the acid value is excessively large, resist film properties (chemical resistance, adhesion property to a substrate, electrical insulating property and hardness or the like) may be eteriorated.

Specific examples of such resins (I-1) include (I-1-i) a reaction product of an acid group-containing acrylic resin obtained by polymerizing an ethylenic unsaturated acid as an essential monomer and alicyclic epoxy group and/or oxetane group-containing unsaturated compound.

The acid group-containing acrylic resin which is a preparation raw material of the compound (I-1-i) is obtained by polymerizing the ethylenic unsaturated acid as the essential monomer. Specific examples thereof include a homopolymer of the ethylenic unsaturated acid and a copolymer of the ethylenic unsaturated acid and "another monomer". At least one kind thereof may be used.

Specific examples of the ethylenic unsaturated acids include (meth) acrylic acid, 2-carboxyethyl (meth)acrylate, 2-carboxypropyl(meth)acrylate, maleic acid anhydride, fumaric acid, crotonic acid, cinnamic acid, fumaric acid monomethyl, fumaric acid monoethyl, fumaric acid monopropyl, maleic acid monomethyl, maleic acid monoethyl, maleic acid monopropyl and sorbic acid. At least one kind thereof may be used.

Specific examples of the above-mentioned "another monomers" include C1 to C8 alkyl(meth)acrylate [methyl(meth)acrylate and ethyl(meth)acrylate or the like], 2-hydroxy C1 to C18 alkyl(meth)acrylate [2-hydroxymethyl(meth)acrylate, 2-hydroxyethyl(meth)acrylate and 2-hydroxypropyl(meth)acrylate or the like], ethylene glycol monomethyl acrylate, ethylene glycol monomethyl methacrylate, ethylene glycol monoethyl acrylate, ethylene glycol monoethyl methacrylate, glycerol acrylate, glycerol methacrylate, dimethylaminoethyl acrylate ester, dimethylaminoethylmethacrylate ester, tetrahydrofurfuryl acrylate, tetrahydrofurfuryl methacrylate, amide acrylate, amide methacrylate, acrylonitrile, methacrylonitrile, methyl acrylate, methyl methacrylate, ethyl acrylate, ethyl methacrylate, butyl acrylate, butyl methacrylate, isobutyl acrylate, isobutyl methacrylate, 2-ethylhexyl acrylate, 2-ethyl hexylmethacrylate, benzyl acrylate, benzyl methacrylate, carbitol acrylate, carbitol methacrylate, ε-caprolactone denatured tetrafurfuryl acrylate, ε-caprolactone denatured tetrafurfuryl methacrylate, diethylene glycol ethoxyl acrylate, isodecylacrylate, isodecyl methacrylate, octyl acrylate, octyl ethacrylate, lauryl acrylate, lauryl methacrylate, tridecyl acrylate, tridecyl methacrylate, stearyl acrylate and stearyl methacrylate or the like, a vinyl aromatic compound [for example, styrene, α-methylstyrene, vinyltoluene, p-chlor styrene or the like], an unsaturated amide compound [for example, (meth)acrylamide, diacetone acrylamide, N-methylol acrylamide, and N-butoxymethyl acrylamide or the like], a polyolefin compound [for example, butadiene, isoprene and chloroprene or the like] and the others [for example, (meth)acrylonitrile, methyl isopropenyl ketone, vinyl acetate, a VeoVa monomer (produced by Shell Chemical), vinyl propionate, and vinyl piparate]. At least one kind thereof may be used.

Examples of the alicyclic epoxy group and/or oxetane group-containing unsaturated compounds which is another preparation raw material of the compound (I-1-i) include a compound containing a radical polymerization unsaturated group and an alicyclic epoxy group and/or oxetane group in a molecule. Examples of such alicyclic epoxy group and/or oxetane group-containing unsaturated compounds include one represented by the following formula.

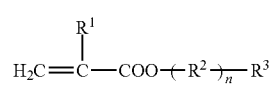

[Formula 1]

In the formula, $R^1$ represents H or $CH_3$ which may have a substituent group.

In the formula, $R^2$ represents a divalent hydrocarbon group which may have a substituent group. Specific examples of $R^2$ include the following groups: methylene, ethylene, propylene, tetramethylene, ethylethylene, pentamethylene, hexamethylene, polymethylene, phenylene, cyclohexylene and xylylene.

In the formula, n represents 0 or 1.

In the formula, $R^3$ represents a monovalent group having an epoxy group and/or oxetane group which may form a condensed ring. Specific examples of $R^3$ include a glycidyl group, an oxetane group, and one represented by the following formula.

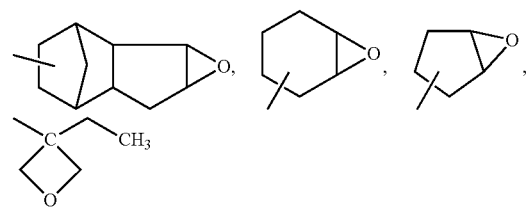

[Formula 2]

Specific examples of the alicyclic epoxy group and/or oxetane group-containing unsaturated compounds include glycidyl(meth)acrylate, C1 to C6 alkyl-2,3-epoxypropyl(meth)acrylate [2-methyl-2,3-epoxypropyl(meth)acrylate, 2-ethyl-2,3-epoxypropyl(meth)acrylate or the like], a compound [3,4-epoxycyclohexylmethyl(meth)acrylate, 3,4-epoxycyclohexylethyl(meth)acrylate, 3,4-epoxycyclohexylbutyl (meth)acrylate and 3,4-epoxycyclohexylmethylaminoacrylate or the like] having an alicyclic epoxy group, and one represented by the following formula. At least one kind thereof may be used.

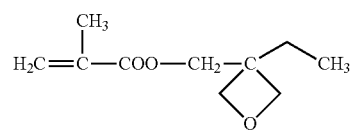

[Formula 3]

The compound (I-1-i) can be prepared by, for example, reacting the acid group-containing acrylic resin with the alicyclic epoxy group and/or oxetane group-containing unsaturated compound under reaction conditions of about 20 to 120° C. and about 1 to 5 hours.

In the compound (I-1-i), the number of unsaturated groups per the average molecular weight of 1000 is preferably 0.2 to 4.0 (particularly, 0.7 to 3.5). When the number of unsaturated groups is excessively few, the curability of the film may be insufficient to exhibit inferior adhesion property to a material to be coated and water resistance or the like. On the other hand, when the number of unsaturated groups is excessively much, the alicyclic epoxy group and/or oxetane group-containing unsaturated compound may thicken and gelate during the addition reaction of the acid group-containing acrylic resin and alicyclic epoxy group and/or oxetane group-containing unsaturated compound.

Alternatively, it is preferable that the compound (I-1-i) has an average molecular weight of 1000 to 100000 (particularly, 3000 to 70000). When the molecular weight of the compound (I-1-i) is excessively small, the film may have poor water resistance. On the other hand, when the molecular weight is excessively large, the compound (I-1-i), which has high viscosity, is inconvenient to handle. In addition, the film may have deteriorated increasing film thickness property and have poor adhesion property to a water resistant material to be coated.

Furthermore, it is preferable that the compound (I-1-i) has an acid value of 300 or less. When the acid value is excessively large, the film may have poor water resistance.

As the compound (I-1-i), one obtained by partially reacting a copolymer of (meth) acrylic acid and alkyl (meth)acrylate with glycidyl(meth)acrylate is preferable.

Other examples of the resins (I-1) include (I-1-ii) a reaction product of an alicyclic epoxy group and/or oxetane group-containing resin obtained by polymerizing the alicyclic epoxy group and/or oxetane group-containing unsaturated compound as the essential monomer and acid group-containing unsaturated compound.

The alicyclic epoxy group and/or oxetane group-containing resin which is a preparation raw material of the compound (I-1-ii) is obtained by polymerizing the alicyclic epoxy group and/or oxetane group-containing unsaturated compound as an essential monomer. Specific examples thereof include a homopolymer of the alicyclic epoxy group and/or oxetane group-containing unsaturated compound, and a copolymer of the alicyclic epoxy group and/or oxetane group-containing unsaturated compound and "another monomer". At least one kind thereof may be used.

Examples of the alicyclic epoxy group and/or oxetane group-containing unsaturated compound and the above-mentioned "another monomer" include ones exemplified in the description of the compound (I-1-i).

Examples of the acid group-containing unsaturated compounds which are another preparation raw materials of the compound (I-1-ii) include a compound having an unsaturated group and an acid group in a molecule. Specific examples of such acid group-containing unsaturated compounds include (meth)acrylic acid, 2-carboxyethyl(meth)acrylate, 2-carboxypropyl(meth)acrylate and maleic acid anhydride. At least one kind thereof may be used.

The compound (I-1-ii) can be prepared by, for example, reacting the alicyclic epoxy group and/or oxetane group-containing resin with the acid group-containing unsaturated compound under reaction conditions of about 20 to 150° C. and about 1 to 7 hours.

In the compound (I-1-ii), the number of unsaturated groups is preferably 0.2 to 4.0 (particularly, 0.7 to 3.5) per the average molecular weight of 1000, and the average molecular weight is preferably 1000 to 100000 (particularly, 3000 to 70000).

Other examples of the resins (I-1) include (I-1-iii) one obtained by subjecting an epoxy group of a polyfunctional epoxy compound having at least two epoxy groups in a molecule and a carboxyl group of an unsaturated monocarboxylic acid to an esterification reaction, and further reacting the produced hydroxyl group with a saturated or unsaturated polybasic acid anhydride.

Specific examples of the above polyfunctional epoxy compounds include a novolak type epoxy resin (for example, one obtained by reacting novolacs with epichlorohydrin and/or methylepichlorohydrin, the novolacs obtained by reacting phenols such as phenol, cresol and alkylphenol with formaldehyde under an acid catalyst). At least one kind thereof may be used. A cresol novolak type epoxy resin and a phenolic novolak type epoxy resin are preferable.

Examples of the above unsaturated monocarboxylic acids include one exemplified as the ethylenic unsaturated acid in the compound (I-1-i). The unsaturated monocarboxylic acid is preferably (meth)acrylic acid.

The above esterification reaction may be whole esterification or partial etherification. The whole esterification is preferable.

Examples of the above polybasic acid anhydrides include dibasic acid anhydrides such as maleic acid anhydride, succinic anhydride, itaconic acid anhydride, phthalic anhydride, tetrahydrophthalic anhydride, hexahydrophthalic anhydride and methylhexahydro phthalic anhydride, and aromatic polyfunctional carboxylic acid anhydrides such as trimellitic anhydride, pyromellitic anhydride and benzophenonetetracarboxylic acid dianhydride. At least one kind thereof may be used. Tetrahydro phthalic anhydride and hexahydro phthalic acid are preferable.

The polybasic acid anhydride of 0.15 mol or more per one hydroxyl group produced is preferably used for the reaction with the above polybasic acid anhydride.

Another examples of the resins (I-1) include (I-1-iV) one obtained by reacting a copolymer of alkyl(meth)acrylate and glycidyl(meth)acrylate with (meth)acrylic acid and further reacting the copolymer with a saturated or unsaturated polybasic acid anhydride.

Examples of the alkyl(meth)acrylates include one exemplified as "another monomer" in the description of compound (I-1-i).

The mixing ratio of the alkyl(meth)acrylate and glycidyl (meth)acrylate in the preparation of the above copolymer is preferably 40:60 to 80:20 in a mol ratio.

It is preferable that the above copolymer has an average molecular weight of 5000 to 70000 (particularly, 10000 to 50000).

Examples of the above polybasic acid anhydrides include one exemplified in the description of the compound (I-1-iii).

The compound (I-1-iV) can be prepared in the same manner as the compound (I-1-iii).

Other examples of the resins (I-1) include (I-1-V) one obtained by reacting a copolymer of hydroxyalkyl(meth) acrylate, alkyl(meth)acrylate and glycidyl(meth)acrylate with (meth)acrylic acid and further reacting the copolymer with the saturated or unsaturated polybasic acid anhydride.

In the hydroxyalkyl(meth)acrylate, a hydroxyalkyl group is preferably a C1 to C6 aliphatic hydrocarbon group having a primary hydroxyl group. Specific examples of the hydroxyalkyl(meth)acrylates include 2-hydroxyethylacrylate and 2-hydroxyethylmethacrylate. At least one kind thereof may be used.

Examples of the alkyl(meth)acrylates include one exemplified as "another monomer" in the description of the compound (I-1-i).

In the preparation of the above copolymer, the mixing rate of the hydroxyalkyl(meth)acrylate, alkyl(meth)acrylate and glycidyl(meth)acrylate is preferably 10 to 50:10 to 70:20 to 60 (particularly, 15 to 30:30 to 50:30 to 50) in a mol ratio.

It is preferable that the above copolymer has an average molecular weight of 10000 to 70000 (particularly, 20000 to 60000).

Examples of the above polybasic acid anhydrides include one exemplified in the description of the compound (I-1-iii).

The compound (I-1-iV) can be prepared in the same manner as the compound (I-1-iii).

Another examples of the resins (I-1) include (I-1-Vi) one obtained by reacting a reaction product of the polyfunctional epoxy compound having at least two epoxy groups in a molecule, unsaturated monocarboxylic acid and compound (hereinafter, also referred to as "hydroxyl group/reactant group-containing compound") having at least two hydroxyl groups and another reactant group in a molecule with the saturated or unsaturated polybasic acid anhydride.

Examples of the above polyfunctional epoxy compounds include one exemplified in the description of the compound (I-1-iii).

Examples of the above unsaturated monocarboxylic acids include one exemplified as the ethylenic unsaturated acid in the compound (I-1-i).

In the above hydroxyl group/reactant group-containing compound, the reactant group is a group reacted with an epoxy group and is a group other than a hydroxyl group. Specific examples thereof include a polyhydroxy-containing monocarboxylic acid such as dimethylol propionic acid. At least one kind thereof may be contained.

In the preparation of the above reaction product, a photoreactive monomer as a component (IV) to be described later may be added as an additive agent.

In the preparation of the above reaction product, the polyfunctional epoxy compound, the unsaturated monocarboxylic acid and the hydroxyl group/reactant group-containing compound are preferably reacted with one another in an ratio of the total amount of the unsaturated monocarboxylic acid and hydroxyl group/reactant group-containing compound being about 0.8 to 1.3 (particularly, about 0.9 to 1.1) mol relative to 1 equivalent of the epoxy group of the polyfunctional epoxy compound. Furthermore, the amount of the hydroxyl group/reactant group-containing compound is preferably 0.05 to 0.5 (particularly, about 0.1 to 0.3) mol relative to 1 mol of the total amount of the unsaturated monocarboxylic acid and hydroxyl group/reactant group-containing compound.

In the preparation of the above reaction product, as the reaction condition, the reaction temperature may be 60 to 150° C. and the reaction time may be 5 to 60 hours.

Examples of the above polybasic acid anhydrides include one exemplified in the description of the compound (I-1-iii).

The reaction of the above polybasic acid anhydride and reaction product is preferably carried out in a reaction ratio of 0.1 to 0.9 equivalent of the polybasic acid anhydride per 1 equivalent of the hydroxyl group in the reaction product prepared above at 60 to 150° C. for 1 to 10 hours.

Other examples of the resins (I-1) include (I-1-Vii) an unsaturated group-containing polycarboxylic acid resin. Specific examples thereof include one obtained by reacting a copolymer of an unsaturated polybasic acid anhydride (maleic acid anhydride or the like) and vinyl group-containing aromatic hydrocarbon (styrene or the like) with hydroxyalkyl (meth)acrylate.

Examples of the above hydroxyalkyl(meth)acrylates include one exemplified in the description of the compound (I-1-V).

Other examples of the resins (I-I) include (I-1-Viii) an unsaturated group-containing polycarboxylic acid urethane resin. Specific examples thereof include a reaction product of the reaction product described in the above (I-1-Vi), saturated or unsaturated polybasic acid anhydride, and unsaturated group-containing monoisocyanate.

Examples of the above polybasic acid anhydrides include one exemplified in the description of the compound (I-1-iii).

Specific examples of the above unsaturated group-containing monoisocyanates include a reaction product or the like obtained by reacting methacryloylisocyanate, methacryloyloxyethylisocyanate or organic diisocyanate (tolylene diisocyanate, xylylene diisocyanate, isophorone diisocyanate, hexamethylene diisocyanate or the like) with (meth)acrylates [hydroxyethyl(meth)acrylate and hydroxypropyl(meth)acrylate or the like] having one hydroxyl group in a molecule in an approximately equimolar ratio.

First, the compound (I-1-Viii) is prepared by reacting the reaction product described in the above (I-1-Vi) with the polybasic acid anhydride in the same manner as the above (I-1-Vi). Then, the unsaturated group-containing monoisocyanate is reacted in a reaction ratio of 0.05 to 0.5 equivalent per 1 equivalent of hydroxyl groups in the resin thus obtained at 60 to 100° C. for 5 to 15 hours to prepare the compound (I-1-Viii).

Other examples of the resins (I-1) include (I-1-iX) an unsaturated fatty acid partial adduct of an epoxy resin.

Examples of such compounds (I-1-iX) include "an unsaturated fatty acid partial adduct of an epoxy resin" (preferably, one obtained by adding an unsaturated fatty acid to 20 to 80%, particularly 40 to 60% of the total number of epoxy groups in an epoxy resin as a raw material) in a photo-thermosetting resin composition described in, for example, Japanese Patent Application Laid-Open No, 2003-105061).

Specific examples of the compounds (I-1-iX) include an adduct of a novolak type epoxy resin and (meth) acrylic acid [a 20 to 80% acrylic acid adduct of a phenolic novolak type epoxy resin and a 40 to 60% acrylic acid adduct of a cresol novolak type epoxy resin], a 40 to 60% acrylic acid adduct of a trisphenylmethane type epoxy resin, a 20 to 80% methacrylic acid adduct of a bisphenol A novolak type epoxy resin, a 20 to 80% methacrylic acid adduct of a dicyclopentadiene phenol type epoxy resin, and a 40 to 60% crotonic acid adduct of a phenol novolak type epoxy resin.

As the resins (I-1), the compounds (I-1-i), (I-1-iV) and (I-1-V) are preferable.

Alternatively, as the resin (I-1), one having no aromatic ring in a molecule is preferable from the viewpoint of resistance to yellowing. Such a resin (I-1) is obtained by using one having no aromatic ring as, for example, a preparation raw material. Alternatively, when one having an aromatic ring as a preparation raw material is used, the resin (I-1) is obtained by suitably hydrogenating an aromatic ring at any of steps of the preparation process of the resin (I-1), for example, at the initial, midway or final step of the preparation process.

Other examples of the components (I) include (I-2) a thermosetting resin. As the resin (I-2), an epoxy compound having at least two epoxy groups in a molecule is preferable from the viewpoints such as the thermosetting property and properties of a cured film. Alternatively, the average molecular weight is preferably 300 to 30000 (particularly, 350 to 20000).

Specific examples of such resins (I-2) include a bisphenol S type epoxy resin, a heterocyclic epoxy resin, a bisphenol type epoxy resin, a biphenyl type epoxy resin, a tetraglycidylxylenoylethane resin, a (hydrogenated) bisphenol A type epoxy resin, a bisphenol F type epoxy resin, a novolak type epoxy resin, a phenolic novolak type epoxy resin, a novolak type epoxy resin of bisphenol A, a chelate type epoxy resin, an amino group-containing epoxy resin, a rubber modified epoxy resin, a dicyclopentadiene phenolic type epoxy resin, a silicone modified epoxy resin and ε-caprolactone modified epoxy resin. At least one kind thereof may be used.

The curable resin composition according to the present invention includes (II) an inorganic filler. The component (II) is preferably subjected to an inorganic (aluminum oxide, silica and zirconium dioxide or the like) surface treatment and/or an organic (long-chain alkyl carboxylic acid, a sylane coupling agent and a titanium coupling agent or the like) surface treatment. The surface treatment can improve the wettability, dispersibility and surface gloss or the like of the inorganic filler.

Examples of the components (II) include a colorant, particularly a white pigment. The average particle diameter of the white pigment is preferably, for example, 0.01 to 2.0 (particularly, 0.1 to 1.0) μm. When the average particle diameter of the white pigment is excessively small, the hiding properties of the coating film may be deteriorated to reduce the reflectivity. On the other hand, when the average particle diameter of the white pigment is excessively large, the surface unevenness of the coating film may increase to reduce the physical properties of the coating film.

Specific examples of the white pigments include titanium oxide, zinc oxide, basic carbonates, basic lead sulfate, lead sulfate, zinc sulfide and antimony oxide. At least one kind thereof may be used. The titanium oxide (a rutile type and/or anatase type) is preferable in wiew of tinting strength and nontoxicity. Since the titanium oxide or the like may have strong photoactivity, and have reduced thermal resistance and weathering resistance in a non-surface treatment, the titanium oxide subjected to the surface treatment using the above inorganic metal oxide is preferable.

Other examples of the components (II) include a thermal conductive material. It is preferable that the thermal conductive material has thermal conductivity of 1.0 or more (W/m·K) (particularly, 1.0 to 500). When the thermal conductivity is excessively small, the thermal radiation of the resist film may be insufficiently obtained. Alternatively, it is preferable that the thermal conductive material has a granular or powder form. The average particle diameter is, for example, 0.1 to 10 (particularly, 0.5 to 5) μm. When the average particle diameter is excessively small, the flowability may be reduced to complicate the high packing ratio. On the other hand, when the average particle diameter is excessively large, the surface unevenness may increase to deteriorate the physical properties of the coating film.

Specific examples of the thermal conductive materials include powders made of oxides such as aluminum oxide (alumina), magnesium oxide and beryllium oxide, nitrides such as aluminium nitride, silicon nitride and boron nitride, carbides such as silicon carbide, metals such as copper, silver and solder, and diamond. At least one kind thereof may be used.

Specific examples of the components (II) other than the above include talc, barium sulfate, barium titanate, silica such as silicon oxide powder, fine powder silicon oxide, amorphous silica, fused silica and crystal silica, powders made of clay, magnesium carbonate, potassium titanate, calcium carbonate, calcium silicate, aluminium hydroxide, magnesium hydroxide, zinc borate, zinc molybdate, zinc hydroxide, mica, mica powder, beryllia, zirconia, zircon, forsterite, steatite, spinel, mullite and titaniaor the like, or beads obtained by conglobtaining them, hollow beads made of them and glass fibers or the like. At least one kind thereof may be used.

The white pigment is preferably contained as the component (II) when high light reflectivity is desired to be applied to the cured film. When the curable resin composition is particularly a resist ink for white printed wiring boards, the content of the white pigment is 5 to 80 (particularly, 10 to 70) % by weight relative to the whole curable resin composition. As a result, generally, the spectral reflection rate of the cured film having a film thickness of 40 μm can be enhanced to 60% or more.

Alternatively, when high thermal radiation is applied to the cured film, it is preferable that the curable resin composition contains the thermal conductive material as the component (II). When the curable resin composition is particularly a resist ink for printed wiring boards for mounting heat-generating components, the content of the thermal conductive material is preferably 5 to 80 (particularly, 10 to 70) % by weight relative to the whole curable resin composition. As a result, generally, the thermal conductivity of the obtained cured film can be enhanced to 1.0 or more (W/m·K).

Alternatively, when both high light reflectivity and thermal radiation are applied to the cured film, it is preferable that the curable resin composition contains both the white pigment and the thermal conductive material as the component (II). The total amount the white pigment and thermal conductive material is preferably 5 to 80 (particularly, 10 to 70) % by weight relative to the whole curable resin composition.

The curable resin composition according to the present invention contains (III) an organic filler. The crack resistance of the cured film can be enhanced by adding the component (III). Such a component (III) has an elastic modulus of 1 to 2000 (MPa) [preferably, 1 to 500 (more preferably, 5 to 100)] and an average particle diameter of 0.01 to 10 (preferably, 0.1 to 5) μm. When the elastic modulus is excessively small, the solder thermal resistance may be reduced to deteriorate the physical properties. On the other hand, when the elastic modulus is excessively large, the effect of the crack resistance may be reduced. When the average particle diameter is excessively small, the dispersibility of the organic filler to the component (I) tends to be reduced. On the other hand, when the average particle diameter is excessively large, the crack resistance, electrical insulating property and solder thermal resistance of the cured film tends to be reduced. In the present invention, an average particle diameter of each of an organic filler and an inorganic filler was determined by means of the Laser Scattering Particle Size Distribution Analyzer (LA-910, product of HORIBA, Ltd.).

Examples of such components (III) include rubber particles. Preferably, specific examples of the rubber particles include silicone type polymer (particularly, silicone rubber) particles and acrylic polymer (particularly acrylic rubber) particles from the viewpoint of the crack resistance, solder thermal resistance and electrical insulating property or the like of the cured film. Particularly, core shell type particles thereof are particularly preferable. The core shell type rubber particles provided with a core part made of a rubbery polymer and a shell part made of a glassy polymer having a glass transition temperature (Tg) higher than that of this rubbery polymer is preferable from the viewpoint of the enhancement in adhesive strength and low stress effect. It is more preferable that the polymer forming the shell part partially contains functional groups such as a carboxyl group, a hydroxyl group and an epoxy group for further enhancing the compatibility and dispersibility with the resin (particularly, the epoxy resin) composition.

Other examples of the components (III) include resin particles made of cross-linking polymethyl methacrylate and cross-linking polybutyl methacrylate or the like. The cross-linking polymethyl methacrylate is obtained by, for example, subjecting a methyl methacrylate monomer to emulsification polymerization and suspension polymerization in the presence of a cross-linking monomer if necessary. The cross-linking causes no rapid elastic modulus change shown in the thermoplasticity, and causes high thermal resistance and enhanced thermal properties.

Fillers other than the components (II) and (III), for example, an antifoaming agent, a release agent, a finishing agent, a fire retardant, a viscosity modifier, a plasticizer, an antimicrobial agent, an antifungal agent, a leveling agent, a stabilizer, a coupling agent and an antioxidant or the like can be further added into the curable resin composition according to the present invention.

A diluent can be further added into the curable resin composition according to the present invention. Examples of the diluents include an organic solvent. Examples of the organic solvents include ketones such as methyl ethyl ketone and cyclohexanone, aromatic hydrocarbons such as toluene, xylene and tetramethylbenzene, glycol ethers such as cellosolve, methyl cellosolve, butyl cellosolve, carbitol, methyl carbitol, butyl carbitol, propylene glycol monomethyl ether, dipropylene glycolmonomethyl ether, dipropylene glycol diethyl ether and triethyleneglycol monoethylether, acetate esters such as ethyl acetate, butyl acetate, cellosolve acetate, butyl cellosolve acetate, carbitol acetate, butyl carbitol acetate, propylene glycol monomethyl ether acetate and dipropylene glycolmonomethyl ether acetate, alcohols such as ethanol, propanol, ethylene glycol and propylene glycol, aliphatic hydrocarbons such as octane and decane, and petroleum solvents such as petroleum ether, petroleum naphtha, hydrogenated petroleum naphtha and solvent naphtha. At least one kind thereof may be used.

A thiol derivative can be further added into the curable resin composition according to the present invention. The curing reaction can be promoted by adding the thiol derivative and the coating film adhesion property can be also enhanced. Furthermore, the thiol derivative has a function to reduce the elastic modulus of a cured resin, and therefore, is effective as an auxiliary material for enhancing the crack resistance of the cured film. Examples of such thiol derivatives include trimethylolpropanetris (3-mercaptopropionate), pentaerythritoltetrakis (3-mercaptopropionate) and dipentaerithritolhexakis (3-mercaptopropionate) and tris[(3-mercaptopropionyloxy)-ethyl]isocyanurate. At least one kind thereof may be used.

A low elasticity curable resin can be further added into the curable resin composition according to the present invention. Tg of the cured resin can be reduced by adding the low elasticity curable resin, and as a result, the crack resistance of the cured film can be further enhanced. The elastic modulus of the low elasticity curable resin is preferably, for example, 1 to 2000 (MPa) (particularly, 4 to 1000). Examples of such low elasticity curable resins include a polymer partially containing functional groups such as a carboxyl group, a hydroxyl group, an epoxy group, an acrylic group and an alkoxyl group. Specific examples thereof include an acrylic resin obtained by partially applying a functional group to an unsaturated group-containing monomer of an acrylic copolymer, a silicone resin and a rubber resin such as butadiene.

In the mixing composition of the curable resin composition according to the present invention, the amount of the component (II) is 10 to 1200 (preferably, 40 to 1000) parts by weight relative to 100 parts by weight of the component (I), and the amount of the component (III) is 1 to 100 (preferably, 5 to 80) parts by weight relative to 100 parts by weight of the component (I). When the amount of the component (II) is excessively small, sufficiently greater functional properties (reflectivity of light and thermal radiation or the like) may be unable to be applied to the cured film. On the other hand, when the amount is excessively large, the flowability may be poor to deteriorate the coating properties and the insulation properties. When the component (III) is excessively small, sufficiently greater crack resistance may be unable to be applied to the cured film. On the other hand, when the component (III) is excessively large, the flowability may be poor to deteriorate the coating properties.

Alternatively, the content weight ratio of the components (II) to (III) [i.e., component (II)/component (III)] is 1 to 41 (preferably, 5 to 25). When the content weight ratio is excessively low, sufficiently greater functional properties (reflectivity of light and thermal radiation or the like) may be unable to be applied to the cured film. On the other hand, when the content weight ratio is excessively high, sufficiently greater crack resistance may be unable to be applied to the cured film.

Examples of the curable resin compositions according to the present invention include a photo-thermosetting resin composition [that is, a resin composition enabling at least two-stage curing of photo (particularly, ultraviolet) curing and thermal curing. Examples of such photo-thermosetting resin compositions include (A) the resins (I-1) and (I-2), the components (II) and (III), the component (IV), a photoreactive monomer, (V) a photo curing agent, and (VI) a thermal curing agent.

Examples of the components (IV) include a reactive diluent. Specific examples thereof include 2-hydroxyethylacrylate, 2-hydroxyethyl acrylate, N-vinylpyrrolidone, acryloylmorpholine, methoxytetraethylene glycol acrylate, methoxypolyethylene glycol acrylate, polyethyleneglycol diacrylate, N,N-dimethylacrylamide, N-methylol acrylamide, N,N-dimethylaminopropylacrylamide, N,N-dimethylaminoethylacrylate, N,N-dimethylaminopropylacrylate, melamine acrylate, diethylene glycol diacrylate, triethylene glycol diacrylate, propylene glycol diacrylate, dipropylene glycol diacrylate, tripropylene glycol diacrylate, polypropylene glycol diacrylate, phenoxyethylacrylate, tetrahydrofurfurylacrylate, cyclohexyl acrylate, glycerin diglycidyl ether diacrylate, glycerin triglycidyl ether triacrylate, isobornyl acrylate, cyclopentadiene mono or diacrylate, hexanediol, trimethylolpropane, pentaerythritol, ditrimethylolpropane, dipentaerithritol, polyhydric alcohols such as tris-hydroxyethylisocyanurate or an ethylene oxide thereof or multiple acrylates of a propylene oxide adduct, each of methacrylates corresponding to the above acrylate, and mono-, di-, tri- or tri- or more polyester of polybasic acid and hydroxyalkyl(meth) acrylate. At least one kind thereof may be used.

Specific examples of the components (V) include acetophenones such as acetophenone, 2-2-dimethoxy-2-phenylacetophenone, 2-2-diethoxy-2-phenylacetophenone, p-dimethylaminopropiophenone, 1-hydroxycyclohexyl phenylketone, 2-methyl-1-[4-(methylthio)phenyl]-2-morpholino-propane-1-one, 2-benzyl-2-dimethylamino-1-(4-morpholinophenyl)-butanone-1 and N,N-dimethylaminoacetophenone, benzophenones such as benzophenone, methyl benzophenone, 4,4'-bisdimethylaminobenzophenone, 4,4'-bisdiethylaminobenzophenone, Michler's ketone and 4-benzoyl-4'-methyldiphenylsulfite, benzoin ethers such as benzyl, benzoin, benzoin methyl ether, benzoin ethyl ether, benzoin isopropyl ether and benzoin isobutyl ether, ketals such as acetophenonedimethylketal and benzyldimethylketal, thioxanthones such as thioxanthone, 2,4-dimethylhioxanthone, 2,4-diethylthioxantone and 2,4-diisopropylthioxantone, anthraquinones such as 2-methylanthraquinone, 2-ethylanthraquinone, 2-tert-butylanthraquinone, 2-aminoanthraquinone and 2,3-diphenylanthraquinone, organic peroxides such as benzoylperoxide and cumeneperoxide, thiol compounds such as 2,4,5-triarylimidazole dimer, riboflavintetrabutyrate, 2-mercaptobenzimidazole, 2-mercaptobenzooxazole and 2-mercaptobenzothiazole, bis(2,4,6-trimethylbenzoyl)-phenylphosphine oxide, and trimethylolpropanetris(3-mercaptopropionate). At least one kind thereof may be used.

The component (V) can be used in combination with at least a kind of photosensitizers such as tertiary amines such as N,N-dimethylaminoethylesterbenzoate, N,N-dimethylaminoisoamylesterbenzoate, penthyl-4-dimethylaminobenzoate, triethylamine and triethanolamine.

Examples of the components (VI) include imidazole derivatives such as imidazole, 2-methylimidazole, 2 ethylimidazole, 2-ethyl-4-methylimidazole, 2-phenylimidazole, 2-phenyl-4,5-dihydroxymethylimidazole, 4-phenylimidazole, 1-cyanoethyl-2-phenylimidazole and 1-(2-cyanoethyl)-2-ethyl-4-methylimidazole, guanamines such as guanamine, acetoguanamine and benzoguanamine, amine compounds such as dicyandiamide, benzyldimethylamine, 4-(dimethylamino)-N,N-dimethybenzylamine, 4-methoxy-N,N-dimethylbenzylamine, 4-methyl-N,N-dimethylbenzylamine and melamine, and trimethylolpropanetris(3-mercaptopropionate). At least one kind thereof may be used.

In the mixing composition of the resin composition (A) according to the present invention, the amounts of the components are preferably the following relative to 100 part by weight of the total amount of the resins (I-1) and (I-2): the amount of the component (II) is 10 to 1200 (particularly, 40 to 1000) parts by weight: the amount of the component (III) is 1 to 100 (particularly, 5 to 80) parts by weight; the amount of the component (IV) is 1 to 50 (particularly, 5 to 40) parts by weight; the amount of the component (V) is 1 to 40 (particularly, 3 to 30) parts by weight; and the amount of the component (VI) is 0.5 to 30 (particularly, 2 to 20) parts by weight. Alternatively, the content weight ratio of the components (II) and (III) is preferably 1 to 30 (particularly, 5 to 25).

Other examples of the curable resin compositions according to the present invention include a thermosetting resin composition. Examples of the thermosetting resin compositions one contain (B) the resin (I-2), and the components (II), (III) and (VI).

In the mixing composition of the resin composition (B) according to the present invention, the amounts of the components are preferably the following relative to 100 parts by weight of the resin (I-2): the amount of the component (II) is 10 to 1200 (particularly, 40 to 1000) parts by weight; the amount of the component (III) is 1 to 100 (particularly, 5 to 80) parts by weight; and the amount of the component (VI) is 0.5 to 80 (particularly, 2 to 60) parts by weight. Alternatively, the content weight ratio of components (II) and (III) is preferably 1 to 30 (particularly, 5 to 25).

Furthermore, examples of the curable resin compositions according to the present invention include a photo-setting resin composition. Examples of the photo-setting resin compositions include (C) one containing the resin (I-1) and the components (II) to (V). The resin composition (C) may further contain the component (VI).

In the mixing composition of the resin composition (C) according to the present invention, the amounts of the components are preferably the following relative to 100 parts by weight of the resin (I-1): the amount of the component (II) is 10 to 1200 (particularly, 40 to 1000) parts by weight; the amount of the component (III) is 1 to 100 (particularly, 5 to 80) parts by weight; the amount of the component (IV) is 1 to 50 (particularly 5 to 40) parts by weight; and the amount of the component (V) is 1 to 40 (particularly, 3 to 30). Alternatively, the content weight ratio of the components (II) to (III) is preferably 1 to 30 (particularly, 5 to 25).

The resin composition (A) according to the present invention can be cured by, for example, first, carrying out primary curing by light irradiation (wavelength: 300 to 450 nm, exposure amount: 200 to 1000 mj/cm$^2$), and then carrying out secondary curing by heating (at 100 to 170° C. for 20 to 120 minutes).

The resin composition (B) according to the present invention can be cured by, for example, heating (at 100 to 170° C. for 20 to 120 minutes).

The resin composition (C) according to the present invention can be cured by, for example, light irradiation (wavelength: 300 to 450 nm, exposure amount: 200 to 1000 mj/cm$^2$).

Needless to say, the curing can be carried out in multistages by using at least two kinds of curing agents having different reaction start conditions (wavelength and temperature or the like). For example, the thermal curing can be carried out in two-stages of primary curing (at 100 to 120° C. for 10 to 60 minutes) and secondary curing (at 130 to 170° C. for 20 to 120 minutes).

The curable resin composition according to the present invention can be also applied to a resist film coat forming method of any of conventional printed wiring boards. Particularly, the use of a smooth printed wiring board as the printed wiring board enhances the coatability of the circuit and is effective for the further improvement in reliability and hiding properties (copper circuit hiding properties).

EXAMPLES

Preparation of Photo-setting Resin

Preparation Example 1

Into a separable flask equipped with a stirrer, a thermometer, a reflux condenser, a dropping funnel and a nitrogen introducing pipe, 250 parts by weight of dipropylene glycol monomethyl ether and 10 parts by weight of t-butylperoxy-2-ethylhexanoate were charged, and they were heated to 95° C. A mixture of 170 parts by weight of methacrylic acid, 130 parts by weight of methyl methacrylate, 250 parts by weight of dipropylene glycolmonomethyl ether and 10 parts by weight of azobisdimethylvaleronitrile were then added in drops thereto over a period of 4 hours. Furthermore, they were aged for 5 hours to obtain a methacrylic acid-methyl methacrylate copolymer solution having a carboxyl group. Next, into this resin solution while passing mixed gas of 7% oxygen-93% nitrogen, 200 parts by weight of (3, 4-epoxycyclohexyl)methyl methacrylate, 2 parts by weight of triphenylphosphine, and 1 part by weight of hydrochinone monomethyl ether were added, and an addition reaction of them was carried out at 100° C. for 19 hours to obtain an unsaturated group-containing polycarboxylic acid resin solution. Upon measure of the resin physical properties of this unsaturated group-containing polycarboxylic acid resin, the solid content was 51%; the acid value was 105 mgKOH/g; the double bond equivalent was 490 g/mol; and the weight average molecular weight Mw (in terms of polystyrene) was 13000.

Preparation Example 2

Into a separable flask equipped with a reflux condenser, a thermometer, a glass tube for nitrogen substitution and a stirrer, 140 parts by weight of glycidyl methacrylate, 60 parts by weight of methyl methacrylate, 200 parts by weight of carbitol acetate, 0.4 parts by weight of lauryl mercaptan and 6 parts by weight of azobis (isobutyronitrile) were added. They were heated in nitrogen gas flow, and were polymerized at 75° C. for 5 hours to obtain a 50% copolymer solution. Into the above 50% copolymer solution, 0.1 parts by weight of hydrochinone, 74 parts by weight of acrylic acid, and 0.4 parts by weight of dimethylbenzylamine were added, and an addition reaction of them was carried out at 100° C. for 24 hours. Then, 90 parts by weight of tetrahydro phthalic anhydride and 158 parts by weight of carbitol acetate were added thereto, and they were reacted at 100° C. for 3 hours to obtain an unsaturated group-containing polycarboxylic acid resin solution having a solid content of 50%, double bond equivalent of 350 g/mol, an acid value of 91 mgKOH/g and a weight average molecular weight Mw (in terms of polystyrene) of 26000.

Preparation Example 3

215 parts by weight of a cresol novolak type epoxy resin (N-680 produced by Dainippon Ink & Chemicals, Inc., epoxy equivalent=215) was put into a four-necked flask equipped with a stirrer and a reflux condenser. 196 parts by weight of propylene glycol monomethyl ether acetate was added thereto, and was dissolved under heating. Next, 0.46 parts by weight of methylhydrochinone as a polymerization inhibitor and 1.38 parts by weight of triphenylphosphine as a reaction catalyst were added thereto. This mixture was heated at 95 to 105° C., and 72 parts by weight (1 equivalent) of acrylic acid was gradually added in drops thereto. They were reacted for about 32 hours to obtain a reaction product having an acid value of 0.9 mgKOH/g. This reaction product (hydroxyl group: 1 equivalent) was cooled to 80 to 90° C., and 76 parts by weight (0.5 equivalent) of tetrahydrophthalic anhydride was added thereto. They were reacted for about 8 hours, and taken out after being cooled. Thus, a carboxyl group-containing resin solution having a nonvolatile matter of 65% and an acid value of a solid matter of 77 mgKOH/g was obtained.

Preparation of Curable Resin Composition

Examples 1 to 11 and Comparative Examples 1 to 9

According to mixing composition shown in Table 1 and Table 3, the mixing components were uniformly kneaded by three roll mills to prepare a photo-thermosetting resin composition (Examples 1 to 3, 5, 7 to 11 and Comparative Examples 1 to 9), a thermosetting resin composition (Example 6) and a photo-setting resin composition (Example 4).

The elastic moduluses of organic fillers show values obtained by moulding the organic fillers at 150 to 200° C. for 10 minutes using a vacuum pressurization press machine to produce samples and measuring the samples using a tensile tester according to ISO 527-2; 1993 (first edition).

An average particle diameter of each of an organic filler and an inorganic filler in Table 1 and Table 3 was determined by means of the Laser Scattering Particle Size Distribution Analyzer (LA-910, product of HORIBA, Ltd.) as follows.

Test sample and dispersing medium were charged into a sample tube, and dispersed for 10 minutes in an ultrasonic bath. Then, an average particle diameter of the organic filler or the inorganic was determined. When the average particle diameter of organic filler was determined, the mixture of the organic filler, liquid novolak type epoxy resin of bisphenol A and wetting agent (the weight ratio of 1:5:100) which were dispersed with the roll was used as a test sample, and toluen was used as a dispersing medium. When an average particle diameter of an inorganic filler was determined, IPA (isopropyl alcohol) was used as a dispersing medium.

Production of Solder Resist Film Coated Printed Wiring Board

Production Examples 1 to 5, 7 to 11 and Production Comparative Examples 1 to 9

Curable resin compositions (Examples 1 to 5, 7 to 11 and Comparative Examples 1 to 9) were applied onto the entire surface of a printed wiring substrate (thickness: 1 mm, copper circuit thickness: 60 μm, L/S=100 μm/100 μm) by screen printing (100 mesh polyester). The curable resin compositions were put into a hot air circulation type drying furnace, and were preliminarily dried (80° C., 20 minutes) to obtain a drying coating film (film thickness: 20 μm).

Then, the above coating film was irradiated with ultraviolet rays at 500 mj/cm$^2$ through a negative film for solder resist using an ultraviolet ray exposure device (ORC manufacturing Co., Ltd., type HMW-680C) to carry out primary photo curing. The film was developed in a 1 wt % sodium carbonate solution to form a resist coating film pattern exposure-cured (primarily photo cured) on the substrate.

Then, the substrate was preliminarily thermally cured (100° C., 30 minutes), and was then completely cured (150° C., 60 minutes). Thus, solder resist film coated printed wiring boards (Production Examples 1 to 5, 7 to 11 and Production Comparative Examples 1 to 9) were produced.

Production Example 6

A curable resin composition (Example 6) was applied onto the entire surface of the same printed wiring substrate as the above by screen printing (120 mesh polyester). The curable resin composition was preliminarily dried (80° C., 20 minutes) to obtain a drying film (film thickness: 20 μm). The drying coating film was completely cured (150° C., 60 minutes) to produce a solder resist film coated printed wiring board (production Example 6).

Evaluation Tests of Curable Resin Composition

Various evaluation tests of the curable resin compositions (Examples 1 to 11 and Comparative Examples 1 to 9) were carried out by methods shown below. Table 2 and Table 4 show the results of the evaluating tests.
(Dry to Touch Property)

The curable resin compositions were applied onto the surfaces of the printed wiring substrates. The printed wiring substrates were then put into a hot air circulation type drying furnace, and were dried (80° C., 20 minutes). The surfaces onto which the curable resin compositions were applied were then strongly pushed by fingers to examine adhesivity to determine the states of the coating films.

"○" (Good): Neither adherence nor leaving of fingerprints is observed at all.

"Δ" (Average): Adherence and leaving of fingerprints are slightly observed on the surface.

"×" (Poor): Adherence and leaving of fingerprints are notably observed on the surface.

(Developability)

A developing solution of a 1 wt % sodium carbonate solution was sprayed for 60 seconds under spray pressure of $2.0 \times 10^5$ Pa in a developing process in the production of the above solder resist film coated printed wiring board, and a state where a non-exposure part was removed was then visually determined.

"○" (Good): Ink was completely removed in developing to enable the development.

"×" (Poor): A part which was not developed existed in developing.

(Photosensitivity)

An ST-21 step tablet (produced by Stauffer Corporation) was stuck to the dried coating film. The film was irradiated with ultraviolet rays having integrated amount of light of 500 mJ/cm$^2$ and was exposed. Next, the film was developed under spray pressure of $2.0 \times 10^5$ Pa in a 1% sodium carbonate solution for 60 seconds, and the number of steps of the coating film left without being developed was ensured.

Evaluation Tests of Solder Resist Films (Cured Film)

Various evaluation tests of the solder resist films of the printed wiring boards (Production Examples 1 to 11 and Production Comparative Examples 1 to 9) were carried out by methods shown below. Table 2 and Table 4 show the evaluating test results.

(Pencil Hardness)

The pencil hardness was evaluated according to JIS K5600.

(Adhesion Property)

According to JIS K5600, the test piece with 1 mm width was gridironed to make 100 grids and Scotch tape was used to carry out peeling-off test. Peel-off of grid was observed and the following benchmarks for evaluation was used.

"○" (Good): A crossing cut part was not peeled off.

"Δ" (Average): A crossing cut part was slightly peeled off in peeling-off Scotch tape.

"×" (Poor): 40% or more of a crossing cut part was peeled off in peeling-off Scotch tape.

(Solvent Resistance)

Test pieces were immersed in isopropyl alcohol at room temperature for 30 minutes, and abnormality on exterior appearance was observed. Then, peeling test was carried out using Scotch tape (R). The following benchmarks for evaluation were used.

"○" (Good): Exterior appearance of the coating film has no abnormality, no swelling and no peeling-off.

"×" (Poor): Swelling and peeling-off of the coating film are observed.

(Acid Resistance)

Test pieces were immersed in a 10% aqueous hydrogen chloride solution at room temperature for 30 minutes. Abnormality was observed on exterior appearance and then peeling test was carried out using Scotch tape. The following benchmarks for evaluation were used.

"○" (Good): Exterior appearance of the coating film has no abnormality, no swelling and no peeling-off.

"×" (Poor): Swelling and peeling-off of the coating film are observed.

(Solder Thermal Resistance)

Flux W-2704 for leveler [produced by MEC Co., Ltd.] was coated on the test piece, and was immersed in a solder bath at 288° C. for 10 seconds. The same process was repeated three times. The test piece was cooled down to room temperature, and peeling-off test using Scotch tape (R) was carried out to use the following benchmarks for evaluation.

"○" (Good): Exterior appearance of the coating film has no abnormality, no swelling and no peeling-off.

"×" (Poor): Swelling and peeling-off of the coating film are observed.

Alternatively, the evaluation method of crack after the solder thermal resistance test was carried out as follows.

"○" (Good): No crack was observed.

"Δ" (Average): Crack was slightly observed.

"×" (Poor): Crack was remarkably generated.

Alternatively, the evaluation method of adhesion property after solder thermal resistance test was carried out as follows.

According to JIS K5600, the test piece with 1 mm width was gridironed to make 100 grids and Scotch tape was used to carry out peeling-off test. Peel-off of grid was observed and the following benchmarks for evaluation was used.

"○" (Good): A crossing cut part was not peeled off.

"Δ" (Average): A crossing cut part was slightly peeled off in peeling-off Scotch tape.

"×" (Poor): 40% or more of a crossing cut part was peeled off in peeling-off Scotch tape.

(Gold Plating Resistance)

A test substrate was immersed in an acidic defating solution at 30° C. (20% by volume aqueous solution of Metex L-5B produced by Nihon MacDiamid Co. Ltd.) for 3 minutes, and was then washed with water. The test substrate was then immersed in a 14.4% by weight aqueous ammonium persulfate solution at room temperature for 3 minutes, and was washed with water. Furthermore, the test substrate was immersed in a 10% by volume aqueous sulfuric acid solution at room temperature for 1 minute, and was washed with water.

Next, this substrate was immersed in a catalyst solution of 30° C. (a 10% by volume aqueous solution of metal plate activator 350 produced by Meltex Co., Ltd.) for 2 minutes, and was washed with water. The substrate was immersed in a nickel plate solution (produced by Meltex Co., Ltd., a 20% by volume aqueous solution of Melplate Ni-865M, pH 4.6) at 85° C. for 20 minutes to carry out nickel plating. The substrate was then immersed in a 10% by volume aqueous hydrogen sulfate solution at room temperature for 1 minute, and washed with water.

Then, the test substrate was immersed in a gold plating solution (a 15% by volume Aurolectroless UP and 3% by volume aqueous potassium gold cyanide solution produced by Meltex Co., Ltd., pH 6) at 95° C. for 10 minutes to carry out electroless gold plating, washed with water, immersed in warm water at 60° C. for 3 minutes, washed with water, and dried. Scotch tape was adhered to the electroless gold plating evaluation substrate and the tape was peeled off. The condition was observed.

"○" (Good): There is no abnormality.

"Δ" (Average): Peeling-off is slightly observed.

"×" (Poor): Large peeling-off is observed.

(HAST Resistance)

A test substrate was left for 168 hours while an applied voltage of DC 5V was applied between comb type electrodes of a line/space=100 μm/100 μm to which solder resist was applied in an unsaturated pressurized container of 130° C. and 85%. Abnormality on exterior appearance was observed and insulating resistances before and after the test were measured.

For the insulating resistance, "R8340A" (produced by ADVANTEST, digital super high resistance/minute ammeter) was used, and a direct current voltage of 10V was applied for 1 minute according to the insulating resistance test standard of JPCA-HDO1. The insulating resistance was then measured in the applying state.

"○" (Good): Exterior appearance of the coating film has no abnormality.

"Δ" (Average): The electrode has no swelling and no peeling-off although the discoloration of the electrode is observed.

"×" (Poor): The coating film has swelling and/or peeling-off.

(Color Difference Change)

Color difference (ΔE*ab) was determined from L*a*b* colorimetry after being cured and L*a*b* colorimetry after three reflows (peak temperature: 260° C., 5 seconds) by L*a*b* colorimetry using a spectral colorimeter CM-2600d [produced by Konica Minolta Sensing Corporation].

(Spectral Reflectivity)

Reflectivities of 450, 550 and 600 nm were measured by L*a*b* colorimetry after being cured using a spectral colorimeter CM-2600d.

(Thermal Conductivity λ)

According to the standard of JIS R1611, thermal diffusivities (α) were determined by a laser Frasch method, and the thermal conductivities were calculated from specific heat (Cp) and density (ρ).

$$\lambda = \alpha \times Cp \times \rho$$

(Thermal Shock Resistance)

A test piece for 30 minutes at −40° C. and for 30 minutes at 125° C. was repeatedly treated, and after 100 times repeated, the test piece was microscopically observed. The following benchmarks for evaluation was used.

"○" (Good): No crack observed on the coating film.

"Δ" (Average): Cracks are slightly observed on the coating film.

"×" (Poor): Cracks are observed on the coating film.

TABLE 1

| Mixing Composition | (part by weight) | Examples | | | | | | | | | | |
|---|---|---|---|---|---|---|---|---|---|---|---|---|
| | | 1 | 2 | 3 | 4 | 5 | 6 | 7 | 8 | 9 | 10 | 11 |
| Photo-setting resins | Preparation Example 1 | 200 | — | — | 200 | — | — | 200 | 200 | 200 | 200 | 200 |
| | Preparation Example 2 | — | 200 | — | — | — | — | — | — | — | — | — |
| | Preparation Example 3 | — | — | 154 | — | 200 | — | — | — | — | — | — |
| Thermo-setting resins | bisphenol A type epoxy resin | 15 | 10 | — | — | 10 | 80 | 15 | 15 | 15 | 15 | 15 |
| | 3,3',5,5'-tetramethylbiphenyl type epoxy resin | 15 | 10 | 20 | — | 20 | — | 15 | 15 | 15 | 15 | 15 |
| | phenolic novolak type epoxy resin | — | 10 | 10 | — | — | 20 | — | — | — | — | — |
| Inorganic fillers | titanium oxide (surface treated article, average particle diameter: 0.3 μm) | 500 | — | — | 80 | — | — | 1269.2 | 101.5 | 203.1 | 500 | 500 |
| | aluminum oxide (average particle diameter: 3 μm, thermal conductivity 30.2 W/m·K | — | 600 | — | — | 500 | 600 | — | — | — | — | — |
| | barium sulfate (surface treated article, average particle diameter: 0.3 μm) | 20 | 10 | 300 | 20 | 20 | 50 | 50.8 | 4.1 | 8.1 | 20 | 20 |
| Organic fillers | acrylic rubber (elastic modulus: 15 MPa, average particle diameter: 0.5 μm) | 25 | — | — | — | — | — | 105.6 | 2.6 | 105.6 | — | — |
| | acrylic rubber (elastic modulus: 20 MPa, average particle diameter: 0.1 μm) | — | 15 | — | — | — | 30 | — | — | — | — | — |
| | silicone rubber (elastic modulus: 200 MPa, average particle diameter: 1.0 μm) | — | — | 20 | 10 | — | — | — | — | — | — | — |
| | cross-linking polybutyl methacrylate (elastic modulus: 400 MPa, average particle diameter: 5 μm) | — | — | — | — | 20 | — | — | — | — | — | — |

TABLE 1-continued

| | Mixing Composition (part by weight) | Examples | | | | | | | | | | |
|---|---|---|---|---|---|---|---|---|---|---|---|---|
| | | 1 | 2 | 3 | 4 | 5 | 6 | 7 | 8 | 9 | 10 | 11 |
| | acrylic rubber (elastic modulus: 5 MPa, average particle diameter: 1.0 μm) | — | — | — | — | — | — | — | — | — | 25 | — |
| | organic filler (elastic modulus: 1000 MPa, average particle diameter: 6.0 μm) | — | — | — | — | — | — | — | — | — | — | 25 |
| | acrylic rubber (elastic modulus: 0.5 MPa, average particle diameter: 1.0 μm) | — | — | — | — | — | — | — | — | — | — | — |
| | organic filler (elastic modulus: 3000 MPa, average particle diameter: 8.0 μm) | — | — | — | — | — | — | — | — | — | — | — |
| | cross-linking polymethyl methacrylate (elastic modulus: 2300 MPa, average particle diameter: 25 μm) | — | — | — | — | — | — | — | — | — | — | — |
| Diluents | dipentaerithritol hexaacrylate (DPHA) | 20 | 20 | — | — | 20 | — | 20 | 20 | 20 | 20 | 20 |
| | ditrimethylolpropane tetraacrylate | 5 | 5 | 20 | 25 | — | — | 5 | 5 | 5 | 5 | 5 |
| | carbitol acetate | 30 | 30 | 20 | 10 | 20 | 10 | 80 | 20 | 30 | 40 | 40 |
| Curing agents | bis(2,4,6-trimethylbenzoyl)-phenylphosphine oxide | 12 | 12 | — | 4 | — | — | 12 | 12 | 12 | 12 | 12 |
| | 2-methyl-1[4-(methylthio)phenyl]-2-morpholino-propane-1-one | — | — | 12 | — | 12 | — | — | — | — | — | — |
| | 2,4-diethylthioxantone | 1 | 1 | 1 | 1 | 1 | — | 1 | 1 | 1 | 1 | 1 |
| | trimethylolpropanetris(3-mercaptopropionate) | — | — | — | 2 | — | 1 | — | — | — | — | — |
| | melamine | 2 | 2 | 2 | 2 | 2 | — | 2 | 2 | 2 | 2 | 2 |
| | dicyandiamide | — | — | 0.1 | — | — | 5 | — | — | — | — | — |
| | 2-phenyl-4,5-dihydroxymethylimidazole | — | — | — | — | — | 4 | — | — | — | — | — |
| Others | polydimethylsiloxane | 1 | 1 | 1 | 1 | 1 | 1 | 1 | 1 | 1 | 1 | 1 |

TABLE 2

| | | 1 | 2 | 3 | 4 | 5 | 6 | 7 | 8 | 9 | 10 | 11 |
|---|---|---|---|---|---|---|---|---|---|---|---|---|
| | | Examples | | | | | | | | | | |
| Evaluation of Test Results | dry to touch property | ○ | ○ | ○ | ○ | ○ | — | ○ | ○ | ○ | ○ | ○ |
| | developability | ○ | ○ | ○ | ○ | ○ | — | ○ | ○ | ○ | ○ | ○ |
| | photosensitivity | 10 | 8 | 9 | 11 | 8 | — | 8 | 11 | 9 | 9 | 9 |
| | | Production Examples | | | | | | | | | | |
| | pencil hardness | 8H | 8H | 8H | 6H | 8H | 8H | 8H | 7H | 6H | 8H | 8H |
| | adhesion property | ○ | ○ | ○ | ○ | Δ | ○ | Δ | ○ | ○ | ○ | ○ |
| | solvent resistance | ○ | ○ | ○ | ○ | ○ | ○ | ○ | ○ | ○ | ○ | Δ |
| | acid resistance | ○ | ○ | ○ | ○ | ○ | ○ | ○ | ○ | ○ | ○ | ○ |
| | surface state | ○ | ○ | ○ | ○ | Δ | ○ | Δ | ○ | ○ | ○ | ○ |
| | solder thermal resistance | | | | | | | | | | | |
| | peeling-off test | ○ | ○ | ○ | ○ | ○ | ○ | ○ | Δ | ○ | ○ | ○ |
| | crack resistance | ○ | ○ | ○ | ○ | Δ | ○ | Δ | ○ | ○ | ○ | ○ |
| | adhesion property | ○ | ○ | ○ | ○ | Δ | ○ | Δ | ○ | ○ | ○ | ○ |
| | gold plating resistance | ○ | ○ | ○ | ○ | ○ | ○ | ○ | ○ | ○ | ○ | ○ |

TABLE 2-continued

|  | | 1 | 2 | 3 | 4 | 5 | 6 | 7 | 8 | 9 | 10 | 11 |
|---|---|---|---|---|---|---|---|---|---|---|---|---|
| | exterior appearance | ○ | ○ | ○ | ○ | ○ | ○ | ○ | ○ | ○ | ○ | ○ |
| | initial value ($\times 10^{13}\,\Omega$) | 1.3 | 1.5 | 1.2 | 1.7 | 1.1 | 1.7 | 1.2 | 1.8 | 1.2 | 1.5 | 1.4 |
| | after 168 hours ($\times 10^{11}\,\Omega$) | 58.0 | 30.7 | 22.3 | 3.2 | 1.49 | 35.4 | 32 | 52 | 47.2 | 31.6 | 29 |
| | thermal shock resistance | ○ | ○ | ○ | ○ | Δ | ○ | ○ | ○ | ○ | ○ | ○ |
| | color difference change ($\Delta E^*ab$) | 5 | 4.8 | 10 | 4.6 | 12 | 13 | 4.5 | 5.6 | 5.6 | 7.1 | 6.8 |
| | spectral reflectivity (%) | | | | | | | | | | | |
| | 450 nm | 85 | — | 2 | 71 | — | — | 91 | 80 | 82 | 86 | 86 |
| | 550 nm | 81 | — | 2 | 68 | — | — | 88 | 77 | 80 | 82 | 83 |
| | 600 nm | 79 | — | 2 | 65 | — | — | 85 | 73 | 77 | 79 | 79 |
| | thermal conductivity (W/m · K) | 0.5 | 1.2 | 0.5 | 0.5 | 1.0 | 2.0 | — | — | — | — | — |

TABLE 3

| Mixing Composition | | Comparative Examples | | | | | | | | |
|---|---|---|---|---|---|---|---|---|---|---|
| | (part by weight) | 1 | 2 | 3 | 4 | 5 | 6 | 7 | 8 | 9 |
| Photo-setting resins | Preparation Example 1 | 200 | — | 200 | 200 | 200 | 200 | 200 | 200 | 200 |
| | Preparation Example 2 | — | 200 | — | — | — | — | — | — | — |
| | Preparation Example 3 | — | — | — | — | — | — | — | — | — |
| Thermo-setting resins | bisphenol A type epoxy resin | 15 | 15 | 15 | 15 | 15 | 15 | 15 | 15 | 15 |
| | 3,3',5,5'-tetramethylbiphenyl type epoxy resin | 15 | 15 | 15 | 15 | 15 | 15 | 15 | 15 | 15 |
| | phenolic novolak type epoxy resin | — | — | — | — | — | — | — | — | — |
| Inorganic Fillers | titanium oxide (surface treated article, average particle diameter: 0.3 μm) | 500 | — | 1650.0 | 25.4 | 1269.2 | 50.8 | 114.2 | 500 | 500 |
| | Aluminum oxide (average particle diameter: 3 μm, thermal conductivity 30.2 W/m · K) | — | — | — | — | — | — | — | — | — |
| | barium sulfate (surface treated article, average particle diameter: 0.3 μm) | — | 200 | 66.0 | 1.0 | 50.8 | 2.0 | 4.6 | 20 | 20 |
| Organic Fillers | acrylic rubber (elastic modulus: 15 MPa, average particle diameter: 0.5 μm) | — | — | 105.6 | 0.7 | 145.2 | 105.6 | 2.6 | — | — |
| | acrylic rubber (elastic modulus: 20 MPa, average particle diameter: 0.1 μm) | — | — | — | — | — | — | — | — | — |
| | silicone rubber (elastic modulus: 200 MPa, average particle diameter: 1.0 μm) | — | — | — | — | — | — | — | — | — |

TABLE 3-continued

| Mixing Composition (part by weight) | | Comparative Examples | | | | | | | | |
|---|---|---|---|---|---|---|---|---|---|---|
| | | 1 | 2 | 3 | 4 | 5 | 6 | 7 | 8 | 9 |
| | cross-linking polybutyl methacrylate (elastic modulus: 400 MPa, average particle diameter: 5 μm) | — | — | — | — | — | — | — | — | — |
| | acrylic rubber (elastic modulus: 5 MPa, average particle diameter: 1.0 μm) | — | — | — | — | — | — | — | — | — |
| | organic filler (elastic modulus: 1000 MPa, average particle diameter: 6.0 μm) | — | — | — | — | — | — | — | — | — |
| | acrylic rubber (elastic modulus: 0.5 MPa, average particle diameter: 1.0 μm) | — | — | — | — | — | — | — | 25 | — |
| | organic filler (elastic modulus: 3000 MPa, average particle diameter: 8.0 μm) | — | — | — | — | — | — | — | — | 25 |
| | cross-linking polymethyl methacrylate (elastic modulus: 2300 MPa, average particle diameter: 25 μm) | — | 20 | — | — | — | — | — | — | — |
| Diluents | dipentaerithritol hexaacrylate (DPHA) | — | — | 20 | 20 | 20 | 20 | 20 | 20 | 20 |
| | ditrimethylolpropane tetraacrylate | 25 | 25 | 5 | 5 | 5 | 5 | 5 | 5 | 5 |
| | carbitol acetate | 20 | 20 | 80 | 10 | 100 | 30 | 20 | 40 | 40 |
| | bis(2,4,6-trimethylbenzoyl)-phenyl phosphine oxide | 12 | — | 12 | 12 | 12 | 12 | 12 | 12 | 12 |
| Curing agents | 2-methyl-1[4-(methylthio)phenyl]-2-morpholino-propane-1-one | — | 12 | — | — | — | — | — | — | — |
| | 2,4-diethylthioxantone | 1 | 1 | 1 | 1 | 1 | 1 | 1 | — | 1 |
| | trimethylolpropanetris(3-mercaptopropionate) | — | — | — | — | — | — | — | — | — |
| | melamine | 2 | 2 | 2 | 2 | 2 | 2 | 2 | 2 | 2 |
| | dicyandiamide | 0.5 | — | — | — | — | — | — | — | — |
| | 2-phenyl-4,5-dihydroxymethylimidazole | — | — | — | — | — | — | — | — | — |
| Others | polydimethylsiloxane | 1 | 1 | 1 | 1 | 1 | 1 | 1 | 1 | 1 |

TABLE 4

| | | 1 | 2 | 3 | 4 | 5 | 6 | 7 | 8 | 9 |
|---|---|---|---|---|---|---|---|---|---|---|
| | | Comparative Examples | | | | | | | | |
| Evaluation of Test Results | dry to touch property | ○ | ○ | ○ | ○ | ○ | ○ | ○ | Δ | ○ |
| | developability | ○ | ○ | ○ | ○ | ○ | ○ | ○ | ○ | ○ |
| | photosensitivity | 9 | 10 | 6 | 11 | 7 | 10 | 11 | 9 | 9 |
| | | Production Comparative Examples | | | | | | | | |
| | pencil hardness | 8H | 8H | 8H | 6H | 7H | 5H | 7H | 7H | 8H |
| | adhesion property | x | x | x | ○ | ○ | ○ | ○ | ○ | Δ |
| | solvent resistance | ○ | ○ | ○ | ○ | ○ | ○ | ○ | ○ | x |

TABLE 4-continued

|   | 1 | 2 | 3 | 4 | 5 | 6 | 7 | 8 | 9 |
|---|---|---|---|---|---|---|---|---|---|
| acid resistance | ○ | ○ | ○ | ○ | ○ | ○ | ○ | ○ | ○ |
| surface state | ○ | x | x | ○ | x | ○ | ○ | Δ | Δ |
| solder thermal resistance | | | | | | | | | |
| peeling-off test | ○ | x | x | Δ | Δ | ○ | ○ | Δ | Δ |
| crack resistance | x | x | x | Δ | ○ | ○ | Δ | ○ | x |
| adhesion property | x | x | x | Δ | ○ | ○ | ○ | ○ | x |
| gold plating resistance | Δ | x | x | ○ | Δ | ○ | ○ | ○ | Δ |
| exterior appearance | Δ | x | x | ○ | Δ | ○ | ○ | Δ | Δ |
| initial value ($\times 10^{13}\,\Omega$) | 1.1 | 1.1 | 1.3 | 1.7 | 1.6 | 1.4 | 1.6 | 1.3 | 1.7 |
| after 168 hours ($\times 10^{11}\,\Omega$) | 1.00 | 1.50 | 9.4 | 43 | 11 | 32.5 | 35.4 | 24.2 | — |
| thermal shock resistance | Δ | x | x | Δ | Δ | ○ | Δ | ○ | Δ |
| color difference change ($\Delta E^*ab$) | — | — | 4.6 | 5.8 | 5.3 | 5.9 | 5.1 | 7.5 | 7.4 |
| spectral reflectivity (%) | | | | | | | | | |
| 450 nm | 86 | — | 92 | 58 | 88 | 61 | 81 | 85 | 85 |
| 550 nm | 82 | — | 90 | 55 | 85 | 58 | 79 | 82 | 83 |
| 600 nm | 79 | — | 87 | 51 | 82 | 55 | 76 | 78 | 78 |
| thermal conductivity (W/m·K) | 0.5 | 0.4 | — | — | — | — | — | — | — |

Items (1) to (3) represent the followings in Tables 1 and 3.
(1): Epoxy equivalent: 173 g/eq
(2): Epoxy equivalent: 188 g/eq
(3): Epoxy equivalent: 178 g/eq As is apparent from Tables 1 to 4, the alkali developing type solder resist ink (using, for example, the epoxy resin and the unsaturated group-containing polycarboxylic acid resin) according to the present invention is excellent in lead free solder thermal resistance (peeling prevention and discoloration prevention) or the like, and furthermore, has excellent discoloration resistance and thermal shock resistance when the solder resist ink is left at high temperature. Furthermore, the functional inorganic filler can be highly packed, and as a result, high reflectivity and high thermal conductivity can be attained. Therefore, the ink of present invention is a curable resin composition capable of responding to the high-performability of electronic equipments.

Particularly, the present inventors consider that the ink has solder thermal resistance and little discoloration of the resist, and has enhanced long period high temperature discoloration resistance, whiteness degree and reflectivity. The ink is very useful as a white solder resist for LED substrates or the like.

The invention claimed is:

1. A curable resin composition comprising:
(I) 100 parts by weight of a curable resin;
(II) 10 to 1200 parts by weight of an inorganic filler; and
(III) 1 to 100 parts by weight of an organic filler having an elastic modulus of 1 to 2000 (MPa) as measured by using a tensile tester with a sample produced by moulding the organic fillers at 150 to 200° C. for 10 minutes using a vacuum pressurization press machine and an average particle diameter of 0.01 to 10 μm, wherein a content weight ratio of the components (II) to (III) is 1 to 41, wherein
the curable resin (I) contains (I-1) a photo-setting resin having no aromatic ring in a molecule, and
the resin (I-1) is selected from the group consisting of
(I-1-i) a reaction product of an acid group-containing acrylic resin obtained by polymerizing an ethylenic unsaturated acid as an essential monomer and alicyclic epoxy group and/or oxetane group-containing unsaturated compound, (I-1-iV) one obtained by reacting a copolymer of alkyl(meth)acrylate and glycidyl(meth)acrylate with (meth)acrylic acid and further reacting the copolymer with a saturated or unsaturated polybasic acid anhydride, and (I-1-V) one obtained by reacting a copolymer of hydroxyalkyl(meth)acrylate, alkyl(meth)acrylate and glycidyl(meth)acrylate with (meth)acrylic acid and further reacting the copolymer with the saturated or unsaturated polybasic acid anhydride.

2. The curable resin composition according to claim 1, wherein the component (II) is a white pigment and/or a material having thermal conductivity of 1.0 to 500(W/m·K).

3. A method for producing a resist film coated printed wiring board, comprising applying the curable resin composition according to claim 2 onto a surface of a printed wiring board to form a resist film coated printed wiring board.

4. A resist film coated printed wiring board produced by the method according to claim 3.

5. The curable resin composition according to claim 1, wherein the component (III) contains rubber particles.

6. A method for producing a resist film coated printed wiring board, comprising applying the curable resin composition according to claim 5 onto a surface of a printed wiring board to form a resist film coated printed wiring board.

7. A resist film coated printed wiring board produced by the method according to claim 6.

8. The curable resin composition according to claim 1, wherein the curable resin composition is (A) a photo-thermosetting resin composition containing the resin (I-1) and the following resin, (I-2) and components (II) to (VI), or (C) a photo-setting resin composition containing the resin (I-1) and the following components (II) to (V):
(I-2) a thermosetting resin;
(II) an inorganic filler;
(III) an organic filler;

(IV) a photoreactive monomer;
(V) a photo curing agent; and
(VI) a thermal curing agent.

9. A method for producing a resist film coated printed wiring board, comprising applying the curable resin composition according to claim 8 onto a surface of a printed wiring board to form a resist film coated printed wiring board.

10. A resist film coated printed wiring board produced by the method according to claim 9.

11. The curable resin composition according to claim 1, wherein the component (III) contains silicone rubber and/or acrylic rubber.

12. The curable resin composition according to claim 1, wherein the component (III) contains cross-linked polymethyl methacrylate and/or cross-linked polybutyl methacrylate.

13. A method for producing a resist film coated printed wiring board, comprising applying the curable resin composition according to claim 1 onto a surface of a printed wiring board to form a resist film coated printed wiring board.

14. A resist film coated printed wiring board produced by the method according to claim 13.

15. A curable resin composition comprising:
(I) 100 parts by weight of a curable resin;
(II) 10 to 1200 parts by weight of an inorganic filler; and
(III) 1 to 100 parts by weight of an organic filler comprising at least one compound selected from the group consisting of silicon rubber, acrylic rubber, cross-linked polymethyl methacrylate and cross-linked polybutyl methacrylate, said organic filler having an average particle diameter of 0.01 to 10 μm, wherein a content weight ratio of the components (II) to (III) is 1 to 41, wherein the organic filler (III) has an elastic modulus of 1 to 2000 (MPa) as measured by using a tensile tester according to ISO 527-2: 1993, first edition, of a sample produced by moulding the organic fillers at 150 to 200° C. for 10 minutes using a vacuum pressurization press machine, the curable resin (I) contains (I-1) a photo-setting resin having no aromatic ring in a molecule, and the resin (I-1) is selected from the group consisting of (I-1-i) a reaction product of an acid group-containing acrylic resin obtained by polymerizing an ethylenic unsaturated acid as an essential monomer and an alicyclic epoxy group and/or an oxetane group-containing unsaturated compound, (I-1-iV) one obtained by reacting a copolymer of alkyl(meth)acrylate and glycidyl(meth)acrylate with (meth)acrylic acid and further reacting the copolymer with a saturated or unsaturated polybasic acid anhydride, and (I-1-V) one obtained by reacting a copolymer of hydroxyalkyl(meth)acrylate, alkyl(meth)acrylate and glycidyl(meth)acrylate with (meth)acrylic acid and further reacting the copolymer with the saturated or unsaturated polybasic acid anhydride.

* * * * *